(12) United States Patent
Murakami

(10) Patent No.: US 7,233,175 B2
(45) Date of Patent: Jun. 19, 2007

(54) AMPLITUDE LIMITING CIRCUIT

(75) Inventor: Tadamasa Murakami, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/944,754

(22) Filed: Sep. 21, 2004

(65) Prior Publication Data
US 2005/0194997 A1    Sep. 8, 2005

(30) Foreign Application Priority Data
Mar. 8, 2004 (JP) .............................. 2004-064077

(51) Int. Cl.
*H03K 5/22* (2006.01)
(52) U.S. Cl. ........................... 327/65; 326/115; 327/89
(58) Field of Classification Search ................ 326/115; 327/65, 89
See application file for complete search history.

(56) References Cited
U.S. PATENT DOCUMENTS

| | | | |
|---|---|---|---|
| 5,227,681 A * | 7/1993 | Koyama et al. ............. 327/65 |
| 5,384,501 A * | 1/1995 | Koyama et al. ............. 327/336 |
| 6,531,857 B2 * | 3/2003 | Ju .............................. 323/316 |
| 2004/0150464 A1 * | 8/2004 | Khalid ........................ 327/541 |

FOREIGN PATENT DOCUMENTS
JP    2001-127566    5/2001

* cited by examiner

*Primary Examiner*—Timothy P. Callahan
*Assistant Examiner*—Ryan Jager
(74) *Attorney, Agent, or Firm*—Nixon Peabody LLP; Donald R. Studebaker

(57) ABSTRACT

An amplitude limiting value can be set to an intended value of a designer and the dependence of the amplitude limiting value on the temperature can be avoided. An amplitude limiting circuit according to the present invention includes a pair of first conductivity type MOS transistors provided in a diode-connected configuration, which is connected between one output terminal of a differential circuit and the other output terminal thereof, a first source follower circuit comprising second conductivity type first and second MOS transistors connected in series between a first power supply and a second power supply, a second source follower circuit comprising second conductivity type third and fourth MOS transistors connected in series between the first power supply and the second power supply, and a current supply circuit comprising a current source that outputs a current proportional to an absolute temperature and a resistor both of which are connected in series between the first power supply and the second power supply.

6 Claims, 4 Drawing Sheets

AMPLITUDE LIMITING CIRCUIT

BACKGROUND OF THE INVENTION

1. Field of the Invention

The present invention relates to a circuit which limits the maximum amplitudes of signals outputted from a differential output circuit employed in an integrated circuit to arbitrary amplitude values respectively.

2. Description of the Related Art

There has heretofore been known an amplitude voltage limiting circuit simple in configuration, using transistors of so-called "diode connection" wherein the gates and drains of such transistors 40 and 42 as shown in FIG. 1 are respectively connected to one another in an analog circuit having differential outputs symmetric and equal to a center voltage. It is well known that the amplitudes of output signals $O_{utp}$ and $O_{utn}$ are limited by threshold voltages $V_{th}$ of the transistors in the present circuit.

On the other hand, a patent document (Japanese Unexamined Patent Publication No. 2001-127566) has disclosed an example illustrative of both the detection of the peaks of analog signals by using a differential circuit and a source follower circuit and an amplitude detecting circuit using the same.

However, the amplitude limiting circuit shown in FIG. 1 has the problem that a limiting voltage is limited by the threshold value $V_{th}$ of each transistor, corresponding to a process parameter and hence a designer encounters difficulties in setting it to a desired value. Since the threshold value $V_{th}$ remains unchanged even if, for example, the gate widths and the gate lengths of the diode-connected transistors are changed, it was difficult to set the limiting voltage to an arbitrary value desired by the circuit designer. Further, the amplitude liming circuit has a drawback in that since the threshold value $V_{th}$ of each transistor depends on the temperature, an amplitude limiting voltage changes depending on the temperature.

SUMMARY OF THE INVENTION

With the foregoing problems in view, the present invention provides an amplitude liming circuit that limits amplitude values of differential signals outputted from a differential circuit supplied with input signals, which comprises:

a pair of first conductivity type MOS transistors provided in a diode-connected configuration, which is connected between one output terminal of the differential circuit and the other output terminal thereof;

a first source follower circuit comprising second conductivity type first and second MOS transistors connected in series between a first power supply and a second power supply;

a second source follower circuit comprising second conductivity type third and fourth MOS transistors connected in series between the first power supply and the second power supply; and a current supply circuit comprising a current source that outputs a current proportional to an absolute temperature and a resistor both of which are connected in series between the first power supply and the second power supply, wherein one output signal of the differential circuit is set as a gate input to the first MOS transistor in the first source follower circuit, and a connecting node of the first and second transistors is configured as a gate input of one of the pair of first conductivity type transistors, wherein the other output signal of the differential circuit is set as a gate input to the third MOS transistor in the second source follower circuit, and a connecting node of the third and fourth transistors is configured as a gate input of the other of the pair of first conductivity type transistors, and wherein a connecting node of the current source and the resistor in the current supply circuit is configured as each of a gate input of the second MOS transistor of the first source follower circuit and a gate input of the fourth MOS transistor of the second source follower circuit.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Figure 1:
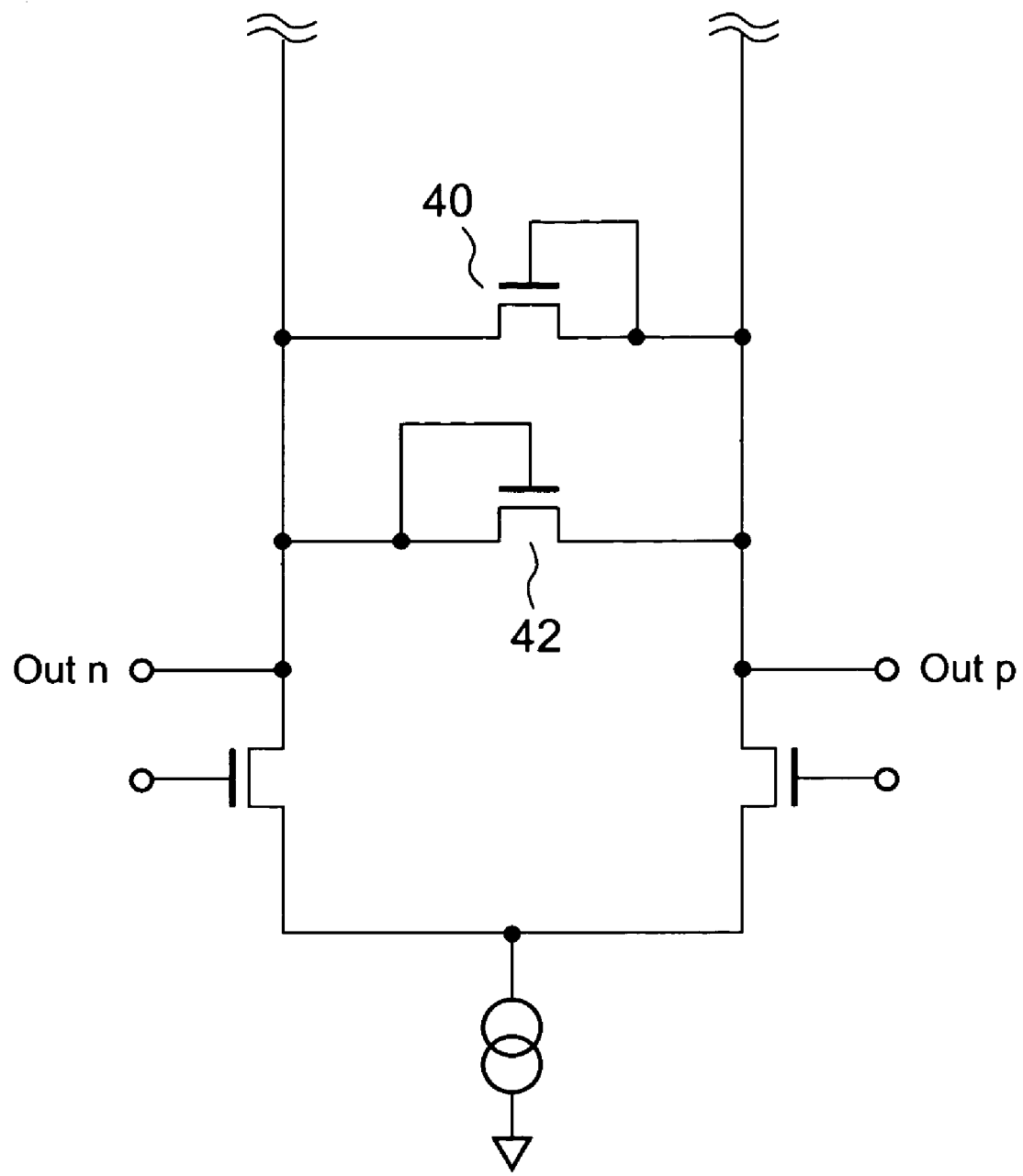
FIG. 1 is a circuit diagram showing one example of a conventional amplitude limiting circuit.

Preferred embodiments of the present invention will be described hereinbelow in detail with reference to the accompanying drawings. Incidentally, the drawings merely schematically show the size, shape and positional. relationships of respective components to such a degree that the present invention can be understood.

<First Embodiment>

FIGS. 2(*a*) and 2(*b*) are respectively circuit diagrams each showing an amplitude limiting circuit according to a first embodiment of the present invention. In FIG. 2(*a*), the amplitude limiting circuit comprises a differential circuit 10, a first source follower circuit 12 and a second source follower circuit 14. The first source follower circuit 12 comprises an NMOS transistor 1 and a current source 2. The second source follower circuit 14 comprises an NMOS transistor 3 and a current source 4. Further, the differential circuit 10 comprises NMOS transistors 8 and 9 for inputting signals, PMOS transistors 5 and 6 each used to limit the amplitude of an output signal, and a current source 7.

Similarly, a third source follower circuit 16 is provided as an alternative to the first source follower circuit 12 in the circuit shown in FIG. 2(*b*). This circuit comprises a current source 11 and a PMOS transistor 12. Further, a fourth source follower circuit 18 is provided instead of the second source follower circuit 14. This circuit comprises a current source 13 and a PMOS transistor 14. The first source follower circuit 12 and the third source follower circuit 16, and the second source follower circuit 14 and the fourth source follower circuit 18 are merely different in terms of the relationship of connections to a power supply with being different from one another in transistor's conductivity type. Therefore, there is essentially no difference among them.

The gate of the PMOS transistor 5 of the differential circuit 10 is connected to a source node A1 of the NMOS transistor 3 in the second source follower circuit 14. The gate of the PMOS transistor 6 is connected to a source node A2 of the NMOS transistor 1 in the first source follower circuit 12. One output $O_{utp}$ of the differential circuit 10 is connected to the gate of the NMOS transistor 3 of the second source follower circuit 14, whereas the other output $O_{utn}$ thereof is connected to the gate of the NMOS transistor 1 in the first source follower circuit 12.

Figure 2A:
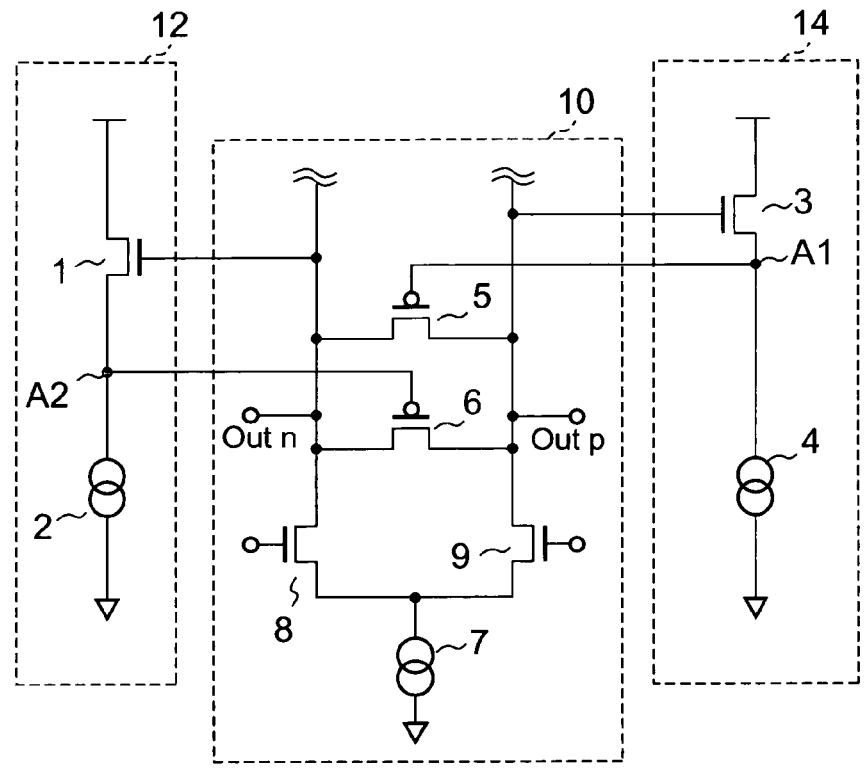
FIGS. 2(*a*) and 2(*b*) are circuit diagrams illustrating an amplitude liming circuit according to a first embodiment of the present invention.
Figure 2B:
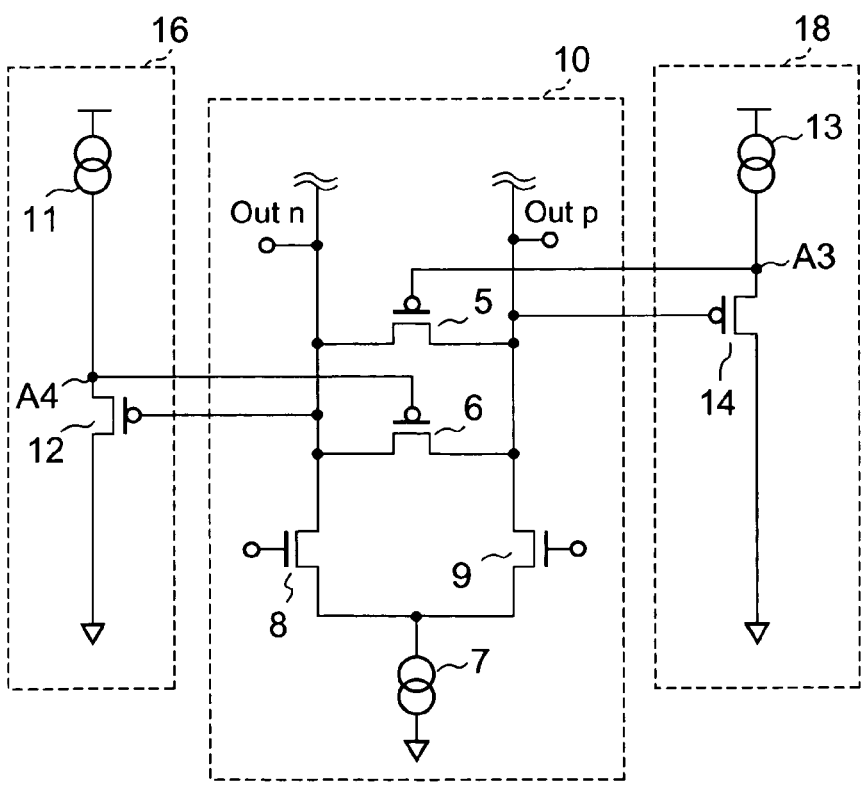

Similarly, the gate of the PMOS transistor 5 in the differential circuit 10 shown in FIG. 2(b) is connected to a source node A3 of the PMOS transistor 14 in the fourth source follower circuit 18. The gate of a PMOS transistor 6 is connected to its corresponding source node A4 of the PMOS transistor 12 of the third source follower circuit 16. One output $O_{utp}$ of the differential circuit 10 is connected to the gate of the PMOS transistor 14 in the fourth source follower circuit 18, whereas the other output $O_{utn}$ thereof is connected to the gate of the PMOS transistor 12 in the third source follower circuit 16.

Incidentally, since the source follower circuits 12 and 16 are respectively operated similarly and the source follower circuits 14 and 18 are respectively operated similarly, the following description of operation will be explained with reference to FIG. 2(a).

When signals each having large amplitude are inputted to the differential circuit shown in FIG. 2(a), they are outputted to both the output terminals of $O_{utp}$ and $O_{utn}$, and the potentials of the nodes A1 and A2 result in ones obtained by varying a DC potential by $\pm\{V_{th2}+(I_1/(k*W/L))^{1/2}\}$ from the $O_{utp}$ and $O_{utn}$. At this time, (+) of sign $\pm$ indicates a case in which the source follower circuit shown in FIG. 2(b) is used, whereas (−) thereof indicates a case in which the source follower circuit shown in FIG. 2(a) is used. $V_{th2}$ indicates each of threshold values of the NMOS transistors 1 and 3 of the source follower circuits 12 and 14 or the PMOS transistors of the source follower circuits 16 and 18. $I_1$ indicates the value of a current produced from the current source, which flows through each source follower circuit, k indicates a constant supplied according to a process with respect to each of the PMOS transistors 5 and 6, and W/L respectively indicate gate widths and gate lengths of the PMOS transistors 5 and 6, respectively.

A limiting amplitude value $V_{diff}$ between differential outputs at which a current starts to flow through each of the diode-connected PMOS transistors 5 and 6, is given as follows:

$$V_{diff}=V_{th1}\pm\{V_{th2}+(I_1/(k*W/L))^{1/2}\}$$

This value is varied by "$\{V_{th2}+(I_1/(k*W/L))^{1/2}\}$" as compared with the conventional circuit shown in FIG. 1. Here, $V_{th1}$ indicates each of threshold voltages of the PMOS transistors 5 and 6.

According to the amplitude limiting circuit of the first embodiment as described above, the limiting amplitude value $V_{diff}$ can be increased and decreased by $\{V_{th2}+(I_1/k*W/L))^{1/2}\}$ from the conventional amplitude value $Vth^1$ where the signals each having the large amplitude are inputted to the differential circuit, thereby making it possible to set the limiting amplitude value small or large according to the intention of a designer. Adjusting the current I1 and the dimension W/L of each transistor makes it possible to vary the limiting value regardless of the threshold value $V_{th}$ of each transistor.

<Second Embodiment>

Figure 3:
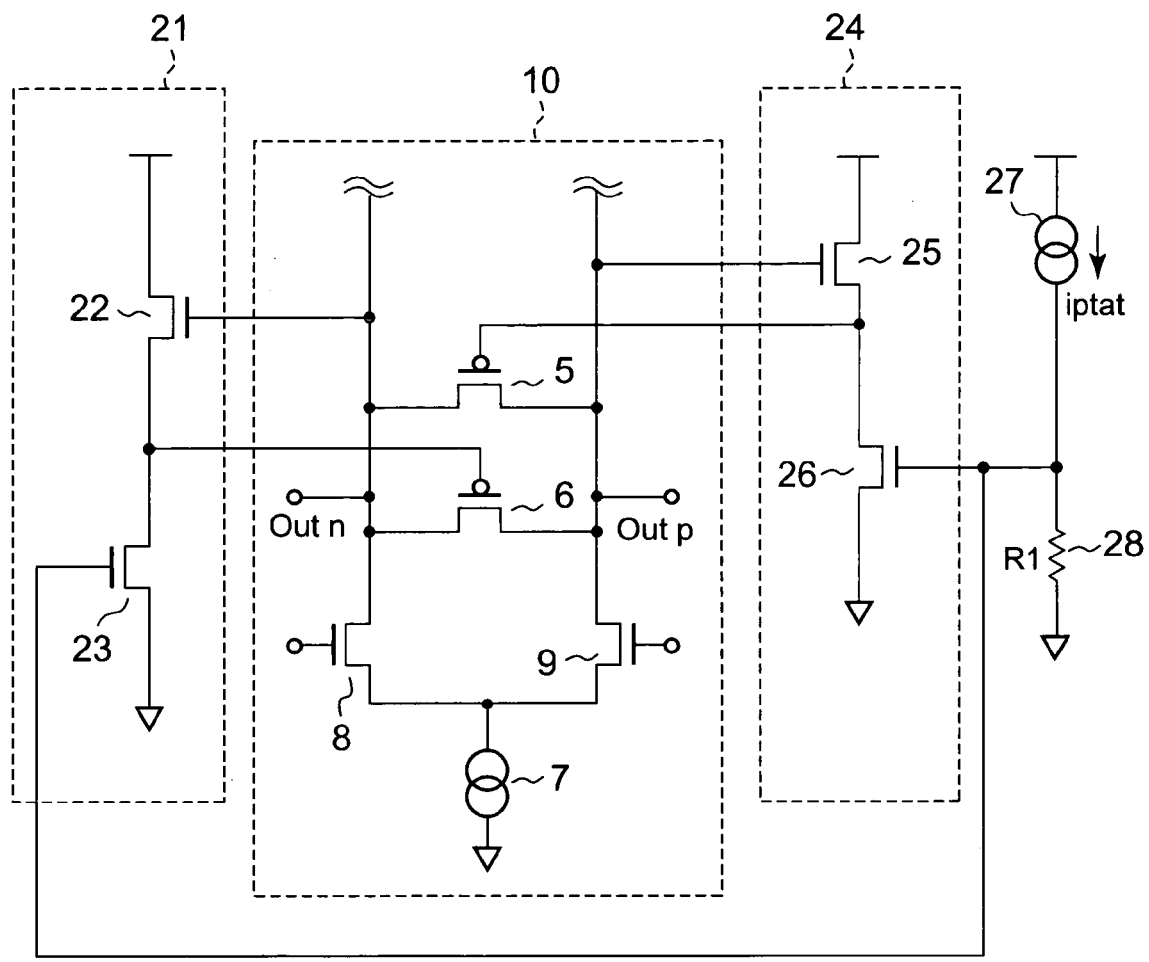
FIG. 3 is a circuit diagram depicting an amplitude liming circuit according to a second embodiment of the present invention.

FIG. 3 is a circuit diagram showing an amplitude limiting circuit according to the second embodiment of the present invention. In the drawing, NMOS transistors 23 and 26 in source follower circuits 21 and 24 are respectively transistors having functions similar to the current sources 2 and 4 in the source follower circuits 12 and 14 shown in FIG. 2.

In the source follower circuit 21 and 24 shown in FIG. 3, one terminal of a resistor R1 is connected to the gates of the NMOS transistors 23 and 26, whereas the other terminal is grounded. A current source 27 is connected to the one terminal of the resistor R1. This current source is a current source capable of causing a current $i_{ptat}$ proportional to the absolute temperature T to flow. The present current source can easily be realized by a bias generator using the characteristic of a PN junction of a semiconductor, e.g., a "bandgap reference circuit".

Let's assume that in the source follower circuits 21 and 24 according to the second embodiment, the ratio (W/L) between a gate length of each of the NMOS transistors 23 and 26 and a gate width thereof is $k_1*(W/L)$ (where $k_1$: constant) with respect to the ratio (W/L) between a gate length of each of NMOS transistors 22 and 25 and a gate width thereof. At this time, an amplitude limiting value $V_{diff}$ is given below as mentioned above:

$$V_{diff}=V_{th1}\pm\{V_{th2}+(I_1/k1*W/L))^{1/2}\}$$

Further, $V_{th1}$ and $V_{th2}$ respectively result in the following expressions:

$$V_{th1}=V_{tp0}*(1+k_p(T-T_0))$$

$$V_{th2}=V_{tn0}*(1+k_n(T-T_0))$$

Figure 4:
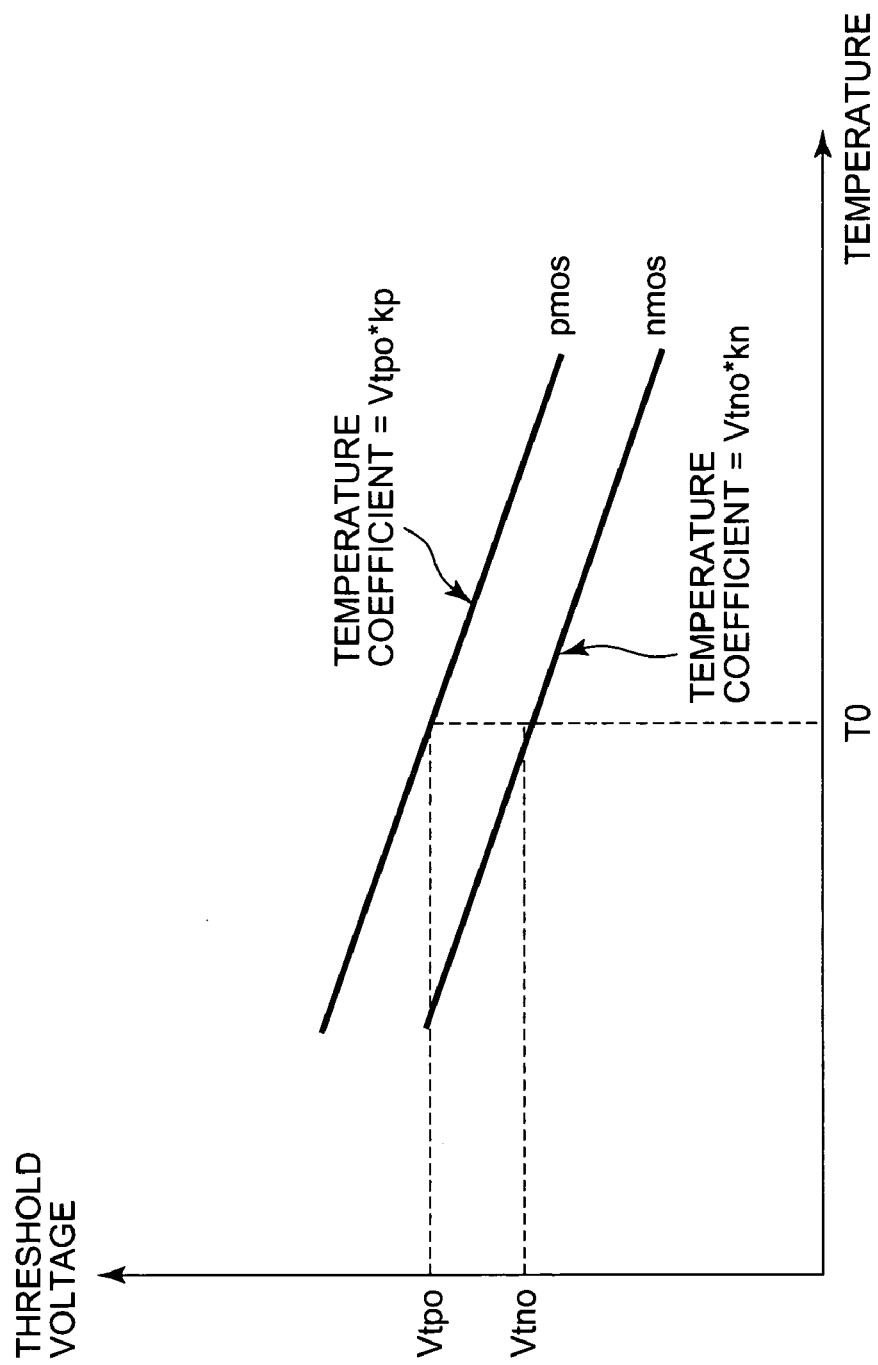
FIG. 4 is a diagram showing one example illustrative of characteristic curves of currents of current sources employed in the second embodiment with respect to the absolute temperature T.

In the present process technology, the assumption can be made that the threshold voltage of each MOS transistor is a proportional characteristic having a factor of $k_p*V_{tp0}$ or $k_n*V_{tn0}$ with respect to the absolute temperature T (see FIG. 4). Here, $T_0$ indicates a reference temperature (e.g., room temperature), and $V_{tn0}$ and $V_{tn0}$ respectively indicate threshold values at the reference temperature.

When the above $V_{diff}$ is expanded, $V_{diff}$ is represented as follows:

$$V_{diff}=V_{tp0}*(1+k_p(T-T_0))-(k_1)^{1/2}*V_{gs}-(1-(k_1)^{1/2})*V_{tn0}*(1+k_n(T-T_0))$$

Here, $V_{gs}$ indicates a gate-to-source voltage of each of the NMOS transistors 23 and 26.

Differentiating the above $V_{diff}$ with respect to the absolute temperature T yields the following expression:

$$dV_{diff}/dT=V_{tp0}*k_p-(k_1)^{1/2}*dV_{gs}/dT-(1-(k_1)^{1/2})*V_{tn0}*k_n$$

Introducing a condition that remains unchanged with respect to the absolute temperature T from $dV_{diff}/dT=0$ on the basis of this expression yields the following relationship:

$$dV_{gs}/dT=\{V_{tp0}*k_p-(1-(k_1)^{1/2})*V_{tn0}*k_n\}/(k_1)^{1/2}.$$

On the other hand, even if the transistors are different in conductivity type on the integrated circuit, the condition of $V_{tn0}*k_n=V_{tp0}*k_p$ is established under a certain process con dition. Therefore, when this condition is substituted into the above expression, the following result is derived therefrom:

$$dV_{gs}/dT = V_{tp0} * k_p$$

Thus, if a temperature coefficient of $V_{gs}$ is set identical to $V_{tp0} * k_p$, then the amplitude limiting value becomes constant regardless of the temperature.

On the other hand, $V_{gs}$ is represented as below from FIG. 3:

$$V_{gs} = R_1 * i_{ptat} = R_1(A*T+B)$$

where A and B indicate a temperature coefficient of the current $i_{ptat}$ and a constant nondependent on the temperature, respectively. Differentiating the $V_{gs}$ with respect to the absolute temperature T yields the following expression:

$$dV_{gs}/dT = A*R_1$$

By rewriting this expression in the following manner, $V_{diff}$ can be made invariable with respect to the absolute temperature T.

Assuming that $i_{ptat} = 20$ (μA) at T=300° K, for example, the values of the above A and B can be respectively set to A=6.67×10$^{-2}$ (μA/° K) and B=0(A). On the other hand, assuming that $V_{tp0} * k_p$=1(mV/K) and the resistor on the integrated circuit in which the resistance value is stable with respect to the temperature, is used as $R_1$, the resistor is set as $R_1 = V_{tp0} * k_p / A = 1/(20/300) = 15(KΩ)$ from above expression, whereby the amplitude limiting value $V_{diff}$ can be made invariable with respect to the temperature.

According to the second embodiment as described above, an advantage is obtained in addition to the advantage of the first embodiment in that since the amplitude limiting value $V_{diff}$ can be made invariable with respect to the temperature, circuit design to be carried out at a subsequent stage or the design of a whole system can be facilitated. Since the characteristic invariable with respect to the absolute temperature T is not restrained by design dimensions of respective transistors constituting a source follower circuit or an amplitude limiting value, it can easily be achieved.

Incidentally, although the transistors diode-connected in the differential circuit make use of the PMOS transistors in the first embodiment, they can be realized even by the NMOS transistors.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An amplitude limiting circuit, comprising:
   a differential circuit which comprises a first transistor having a control electrode, a first electrode connected to a first node and a first output node and a second electrode connected to a second node and a second output node, a second transistor having a control electrode, a first electrode connected to the first output node and a second electrode connected to the second output node, a third transistor having a control electrode connected to a first input node, a first electrode connected to the first electrode of the second transistor and a second electrode, and a fourth transistor having a control electrode connected to a second input node, a first electrode connected to the second electrode of the second transistor and a second electrode connected to the second electrode of the third transistor;
   a first source follower circuit which is connected to the first node and the control electrode of the second transistor, said first source follower circuit comprising a fifth transistor having a control electrode connected to the first node, first electrode supplied with a power supply voltage and a second electrode connected to the control electrode of the second transistor; and a first current source connected to the second electrode of the fifth transistor and supplied with a ground voltage; and
   a second source follower circuit which is connected to the second node and the control electrode of the first transistor, said second source follower circuit comprising a sixth transistor having a control electrode connected to the second node, a first electrode supplied with the power supply voltage and a second electrode connected to the control electrode of the first transistor; and a second current source connected to the second electrode of the sixth transistor and supplied with the ground voltage;
   wherein the differential circuit further comprises:
   a third current source connected to the second electrodes of the third and fourth transistors and supplied with the ground voltage.

2. The amplitude limiting circuit according to claim 1, wherein the first and second transistors are PMOS transistors and the third, fourth, fifth and sixth transistors are NMOS transistors.

3. An amplitude limiting circuit comprising:
   a differential circuit which comprises a first transistor having a control electrode, a first electrode connected to a first node and a first output node and a second electrode connected to a second node and a second output node, a second transistor having a control electrode, a first electrode connected to the first output node and a second electrode connected to the second output node, a third transistor having a control electrode connected to a first input node, a first electrode connected to the first electrode of the second transistor and a second electrode, and a fourth transistor having a control electrode connected to a second input node, a first electrode connected to the second electrode of the second transistor and a second electrode connected to the second electrode of the third transistor;
   a first source follower circuit which is connected to the first node and the control electrode of the second transistor, said first source follower circuit comprising a fifth transistor having a control electrode connected to the first node, a first electrode supplied with a power supply voltage and a second electrode connected to the control electrode of the second transistor; and a sixth transistor having a control electrode, a first electrode supplied with a ground voltage and a second electrode connected to the second electrode of the fifth transistor;
   a second source follower circuit which is connected to the second node and the control electrode of the first transistor, said second source follower circuit comprising a seventh transistor having a control electrode connected to the second node, a first electrode supplied with the power supply voltage and a second electrode connected to the control electrode of the first transistor; and an eighth transistor having a control electrode connected to the control electrode of the sixth transistor, a first electrode supplied with the ground voltage and a second electrode connected to the second electrode of the seventh transistor;
a first current source connected to the control electrode of the eighth transistor and supplied with the power supply voltage; and
a resistor connected to the control electrode of the eighth transistor and supplied with the ground voltage;
wherein the differential circuit further comprises:
a second current source connected to the second electrodes of the third and fourth transistors and supplied with the ground voltage.

4. The amplitude limiting circuit according to claim 3, wherein the first and second transistors are PMOS transistors and the third, fourth, fifth, sixth, seventh and eighth transistors are NMOS transistors.

5. An amplitude limiting circuit, comprising:
a differential circuit which comprises
a first output node;
a second output node;
a first node;
a second node connected to the second output node;
a first transistor having a control electrode, a first electrode connected to the first output node and the first node and a second electrode connected to the second node;
a second transistor having a control electrode, a first electrode connected to the first output node and a second electrode connected to the second electrode of the first transistor;
a third transistor having a control electrode connected to a first input node, a first electrode connected to the first electrode of the second transistor and a second electrode;
a fourth transistor having a control electrode connected to a second input node, a first electrode connected to the second electrode of the second transistor and a second electrode connected to the second electrode of the third transistor;
a first source follower circuit which is connected to the first node and the control electrode of the second transistor, said first source follower circuit comprising a fifth transistor having a control electrode connected to the first node, a first electrode supplied with a ground voltage and a second electrode connected to the control electrode of the second transistor; and a first current source connected to the second electrode of the fifth transistor and supplied with a power supply voltage; and
a second source follower circuit which is connected to the second node and the control electrode of the first transistor, said second source follower circuit comprising a sixth transistor having a control electrode connected to the second node, a first electrode supplied with the around voltage and a second electrode connected to the control electrode of the first transistor; and a second current source connected to the second electrode of the sixth transistor and supplied with the power supply voltage;
wherein the differential circuit further comprises:
a third current source connected to the second electrodes of the third and fourth transistors and supplied with the ground voltage.

6. The amplitude limiting circuit according to claim 5, wherein the first, second, fifth and sixth transistors are PMOS transistors and the third and fourth transistors are NMOS transistors.

* * * * *